United States Patent
Lee et al.

(10) Patent No.: US 7,361,560 B2
(45) Date of Patent: Apr. 22, 2008

(54) METHOD OF MANUFACTURING A DIELECTRIC LAYER IN A MEMORY DEVICE THAT INCLUDES NITRIDING STEP

(75) Inventors: Jai-Dong Lee, Suwon-si (KR); Ki-Chul Kim, Suwon-si (KR); In-Wook Cho, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 362 days.

(21) Appl. No.: 11/033,156

(22) Filed: Jan. 12, 2005

(65) Prior Publication Data

US 2005/0153514 A1    Jul. 14, 2005

(30) Foreign Application Priority Data

Jan. 13, 2004    (KR) ............... 10-2004-0002136

(51) Int. Cl.
*H01L 21/336*    (2006.01)
(52) U.S. Cl. .............. 438/287; 438/591; 438/775; 257/E21.679

(58) Field of Classification Search ........ 438/775, 438/954
See application file for complete search history.

(56) References Cited

U.S. PATENT DOCUMENTS

| | | | | |
|---|---|---|---|---|
| 6,548,425 | B2* | 4/2003 | Chang et al. ............... | 438/786 |
| 6,620,705 | B1* | 9/2003 | Ogle et al. ................. | 438/431 |
| 6,750,157 | B1* | 6/2004 | Fastow et al. ............. | 438/786 |
| 2003/0082884 | A1* | 5/2003 | Faltermeier et al. ........ | 438/387 |
| 2003/0139065 | A1* | 7/2003 | Han .......................... | 438/786 |
| 2003/0148628 | A1* | 8/2003 | Tay et al. ................... | 438/769 |
| 2003/0194853 | A1* | 10/2003 | Jeon .......................... | 438/591 |
| 2003/0232507 | A1* | 12/2003 | Chen .......................... | 438/763 |

* cited by examiner

*Primary Examiner*—Stephen W. Smoot
(74) *Attorney, Agent, or Firm*—Volentine & Whitt, PLLC

(57) ABSTRACT

A method for manufacturing a dielectric layer structure for a non-volatile memory cell is provided. A method includes forming a first dielectric layer for tunneling on a semiconductor substrate, a second dielectric layer on the first dielectric layer to store charges, nitrogenizing surface of the second dielectric layer, and forming a third dielectric layer the nitridedsecond dielectric layer.

10 Claims, 8 Drawing Sheets

METHOD OF MANUFACTURING A DIELECTRIC LAYER IN A MEMORY DEVICE THAT INCLUDES NITRIDING STEP

BACKGROUND OF THE INVENTION

1. Technical Field

The present invention generally relates to a method of manufacturing a non-volatile memory device. More particularly, the present invention generally relates to a method of manufacturing a dielectric layer in a non-volatile memory cell having a silicon oxide nitride oxide semiconductor (SONOS) structure.

A claim of priority is made to Korean Patent Application No. 2004-2136, filed Jan. 13, 2004, the disclosure of which is hereby incorporated.

2. Discussion of the Related Art

Generally, non-volatile memory devices are classified into a floating gate memory device and a metal nitride oxide semiconductor (MNOS) memory device. In the floating gate memory device, erasing is accomplished by transferring electrons from the floating gate; programming is accomplished by transferring electrons into the floating gate. In the MNOS memory device, charge or data is stored in the nitride trap layer.

The conventional MNOS memory device has a metal nitride oxide semiconductor (MNOS) structure or metal oxide nitride oxide semiconductor (MONOS) structure. If a gate is composed of a polysilicon layer instead of a metal, the memory device has a silicon oxide nitride oxide semiconductor (SONOS) structure.

FIG. 1 is a cross-sectional view illustrating a conventional dielectric layer having the SONOS structure.

As shown in FIG. 1, the conventional dielectric layer has an ONO structure in which, a first oxide layer 12, a nitride layer 14, and a second oxide layer 16 are laminated on a semiconductor substrate 10. First oxide layer 12 is a tunnel oxide layer, second oxide layer 16 is a blocking oxide layer, and nitride layer 14 is a charge storage layer.

A method of manufacturing the dielectric layer having the ONO structure is disclosed, for example, in U.S. Patent Application Publication No. 2003.

In the conventional non-volatile memory having the SONOS structure, when high voltage is applied to a gate, electrons tunnel through a substrate and then the electrons are stored in a trap layer.

During data programming, if the trap layer is at a low energy level, charges stored in the trap layer are easily lost, i.e., data is lost. On the other hand, if the trap layer is at high energy level, charges stored in the trap layer are difficult to remove, i.e., data cannot be easily erased. Further, data programming and erasing operations are influenced by a trap area at an interface between an oxide layer and a nitride layer, therefore, causes instability of the memory device. Also, data retention problem occurs when the charge storage layer contains hydrogen ($H^+$). Therefore, developments have been actively pursued for SONOS devices with easier programming and erasing abilities, faster operational speeds at low voltage, and increase memory capacity.

SUMMARY OF THE INVENTION

An aspect of the present invention is to provide a method for manufacturing a dielectric layer structure.

According to the aspect of the present invention, a method for manufacturing a dielectric layer structure in a non-volatile memory cell includes forming a first dielectric layer on a semiconductor substrate, forming a second dielectric layer on the first dielectric layer, nitriding the surface of the second dielectric layer, and forming a third dielectric layer on the nitrided second dielectric layer.

The present invention also provides a method of forming a first dielectric layer on a semiconductor substrate, forming a second dielectric layer on the first dielectric layer, patterning the second dielectric layer to expose a surface portion of the first dielectric layer, nitriding the exposed surface portion of the first dielectric layer and the surface of the second dielectric layer, and forming a third dielectric layer on the nitrided exposed surface portion of the first dielectric layer and the nitrided second dielectric layer.

BRIEF DESCRIPTION OF THE DRAWINGS

The above aspects of the present invention will become more apparent to those of ordinary skill in the art in view of the disclosed detail preferred exemplary embodiments with reference to the attached drawings in which.

DETAILED DESCRIPTION OF THE INVENTION

The present invention will now be described with reference to the accompanying drawings, in which preferred embodiments of the present invention are shown.

It will be understood that when an element such as layer, region or substrate is referred to as being "on" or "onto" another element, the element is either directly on the other element or intervening elements may also be present.

Figure 1:
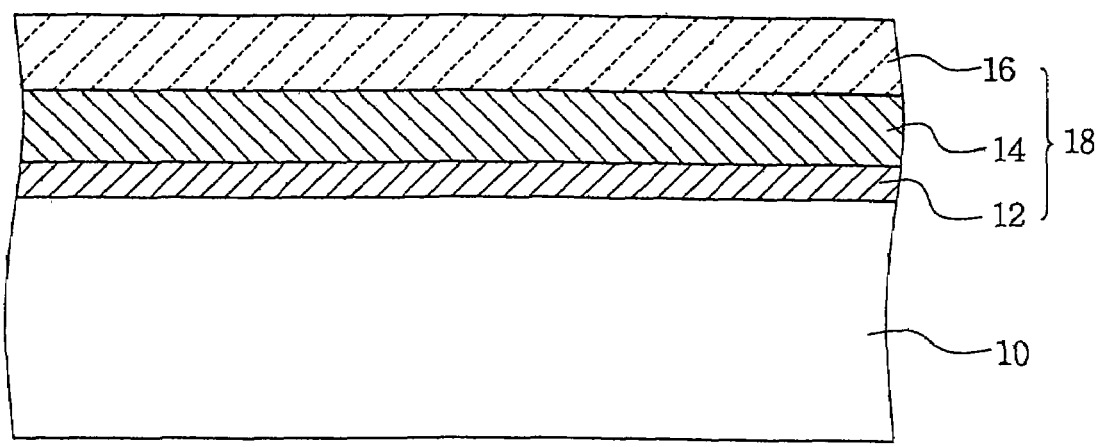
FIG. 1 is a cross-sectional view illustrating a conventional dielectric layer having a SONOS structure in a non-volatile semiconductor memory device.
Figure 2:
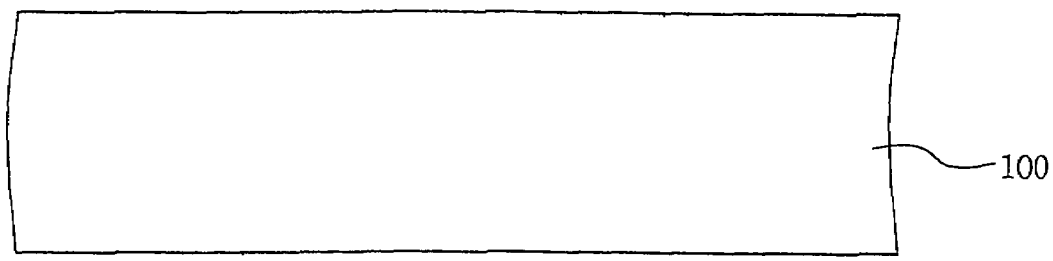
FIGS. 2 to 7 are sectional views illustrating a process sequence for a method of manufacturing a dielectric layer structure according to the present invention.

As shown in FIG. 2, a semiconductor substrate 100 is provided. It is preferable that semiconductor substrate 100 is silicon (Si).

Figure 3:
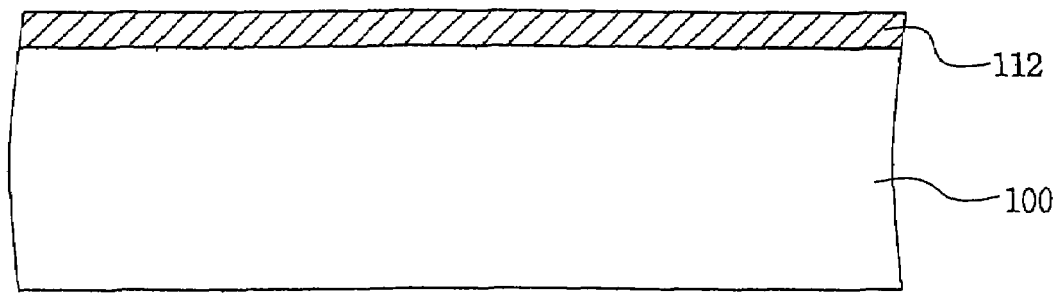

As shown in FIG. 3, a first dielectric layer 112 is formed on semiconductor substrate 100. The first dielectric layer 112 is preferably silicon oxide. First dielectric layer 112 is preferably formed by a chemical vapor deposition (CVD) process or a thermal oxidation process. Further, first dielectric layer 112 is formed to a thickness of about 10 to 100 Å, preferably about 40 Å. In the SONOS structure, first dielectric layer 112 serves as a tunneling oxide layer.

Figure 4:
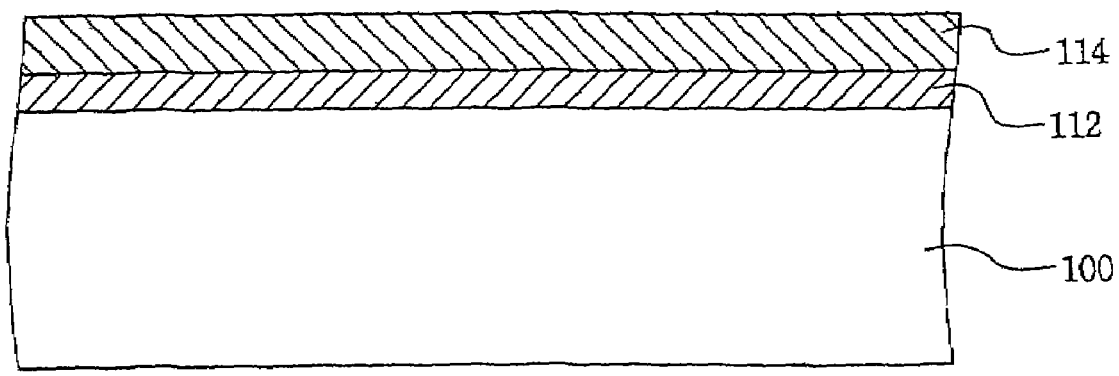

As shown in FIG. 4, a second dielectric layer 114 is formed on first dielectric layer 112. It is preferable that second dielectric layer 114 is nitride. It is also preferable that second dielectric layer 114 is formed by a CVD process or a low pressure chemical vapor deposition (LPCVD) process. Second dielectric layer 114 is formed to a thickness of about 50 to 150 Å, preferably about 80 Å.

In the SONOS structure, second dielectric layer 114 serves to store charges.

Figure 5:
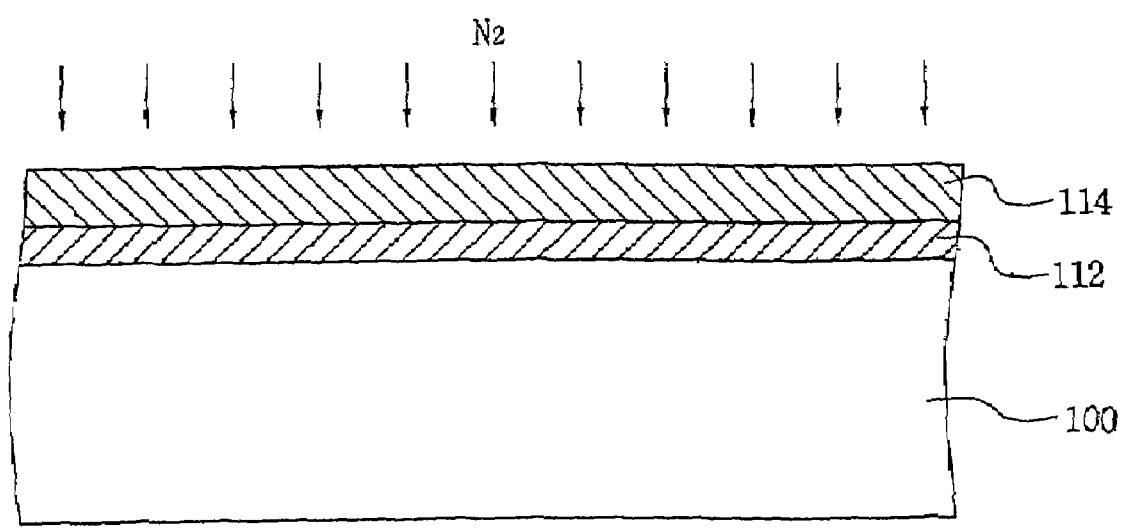

As shown in FIG. 5, the surface of second dielectric layer 114 is nitrided using a decoupled plasma nitridation (DPN) process.

The DPN process uses plasma to induce a reaction between nitrogen ($N_2$) gas and second dielectric layer 114 in room temperature and atmospheric pressure. Only nitrogen gas is used in the DPN process, thus no hydrogen ($H_2$) is introduced into second dielectric layer 114.

A remote plasma nitridation (RPN) process or a rapid thermal nitridation (RTN) process may also be used to nitrogenize second dielectric layer 114.

In the RPN process, ammonia ($NH_3$) gas is used to nitridize second dielectric layer 114 under low pressure and a temperature of 400 to 500° C. In the RTN process, ammonia ($NH_3$) gas at a temperature of 700 to 800° C. is used to nitridize second dielectric layer 114.

Process conditions or nitrogen containing gases for the DPN, RPN and RTN processes are varied to nitridize second dielectric layer 114.

Figure 6:
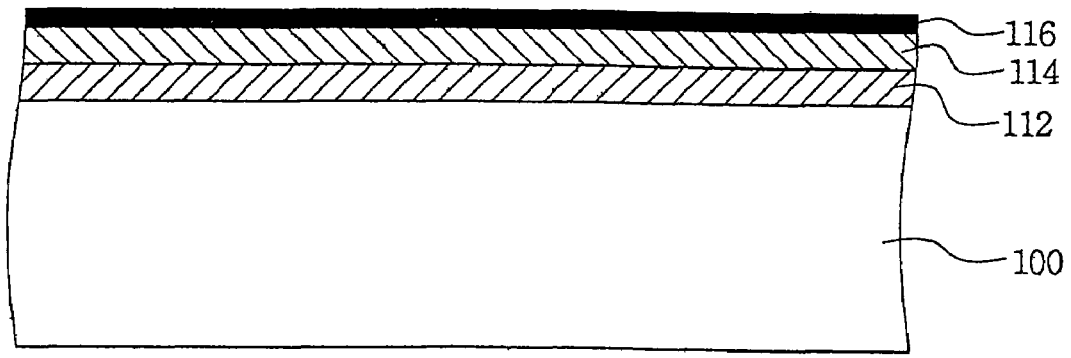

FIG. 6 illustrates the result from the above-described nitridation process. The surface of second dielectric layer 114 is nitrided resulting in a nitrided layer 116.

Figure 7:
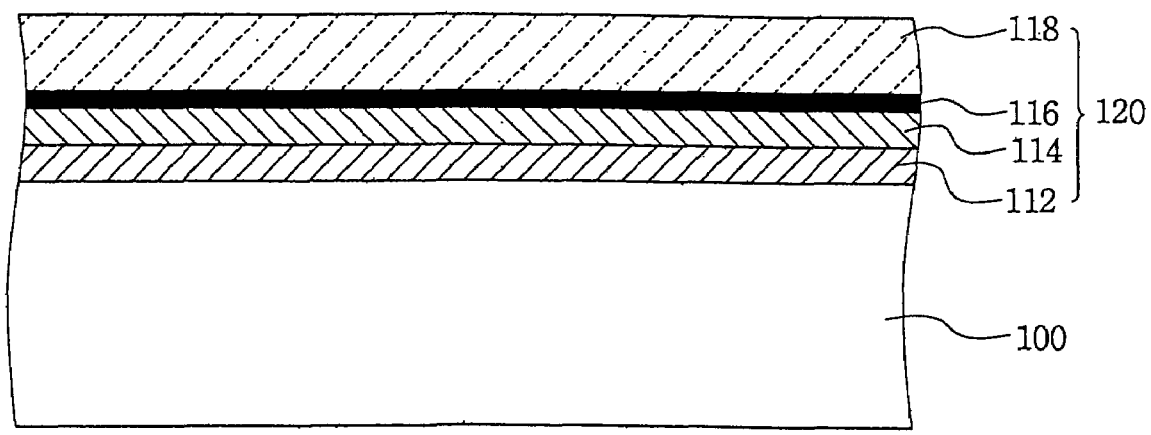

As shown in FIG. 7, a third dielectric layer is formed on nitrided layer 116. It is preferable that third dielectric layer 118 is an oxide film. Third dielectric layer 118 is preferably formed by a chemical vapor deposition (CVD) process or a thermal oxidation process. Further, second dielectric layer 114 is formed to a thickness of about 50 to 200 Å, preferably about 100 Å.

In the SONOS structure, third dielectric layer 118 serves as a blocking oxide layer.

The above described processes result in a dielectric layer structure (ONO) 120 for the non-volatile memory of the present invention. In subsequent processes, a gate is formed on the ONO structure.

Figure 8:
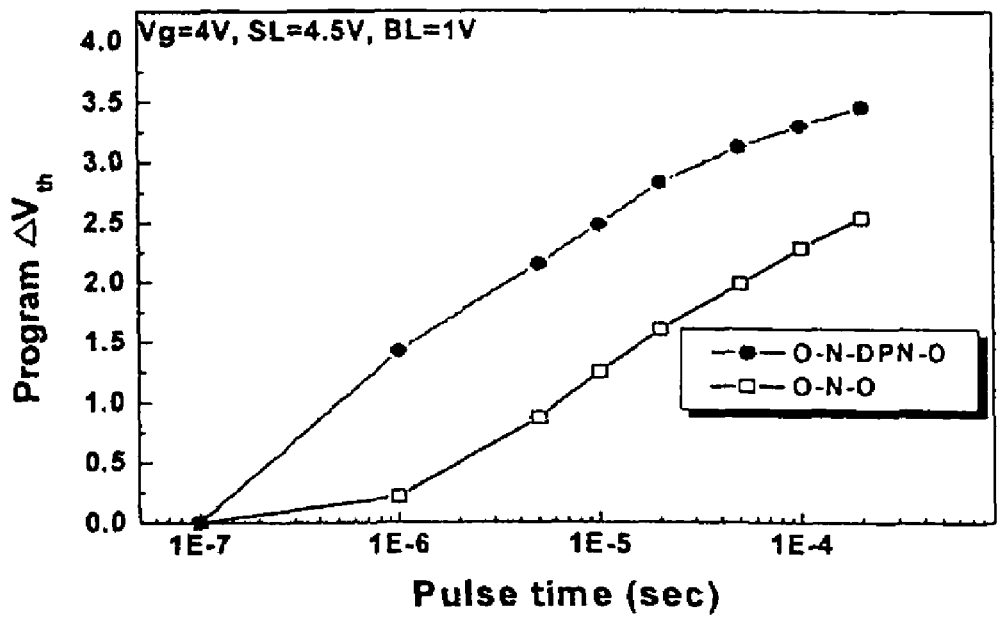
FIG. 8 is a graph showing an operation speed comparison between a memory device having the dielectric layer structure of the prior art and a memory device having the dielectric layer structure according to the present invention.

In FIG. 8 the abscissa axis indicates pulse time and the ordinate axis indicates amount of change in a threshold voltage during programming.

As illustrated in FIG. 8, the operational speed (O-N-DPN-O) of the present invention is superior over the operational speed (O-N-O) of the prior art. That is, a program pulse width is reduced.

Figure 9:
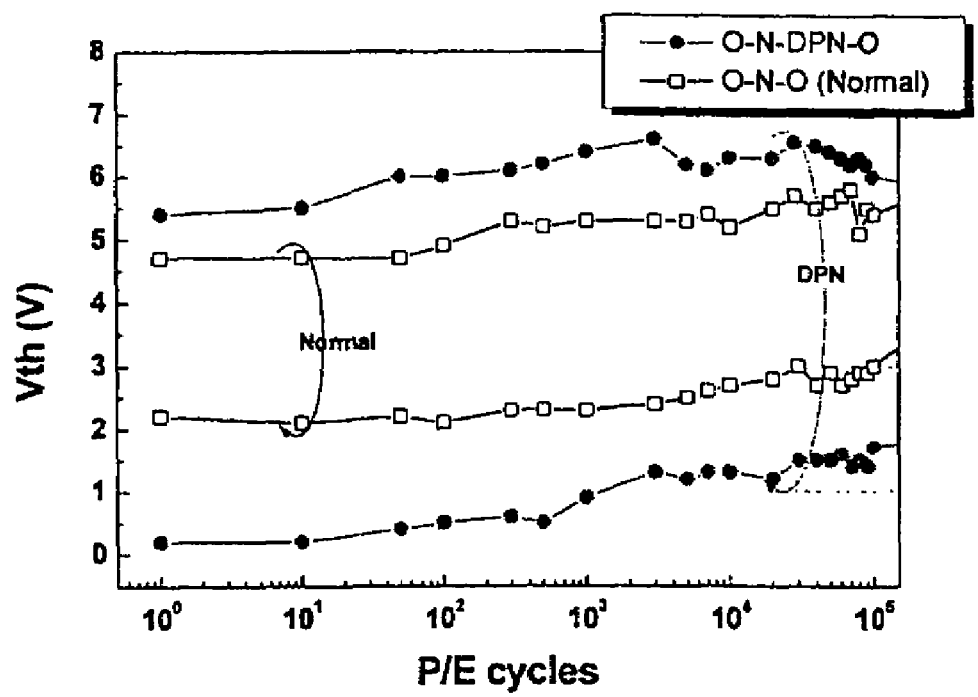
FIG. 9 is a graph showing an endurance comparison between a memory device having the dielectric layer structure of the prior art and a memory device having the dielectric layer structure according to the present invention.

In FIG. 9 the abscissa axis indicates program and erase cycles and the ordinate axis indicates a threshold voltage.

In the graph of FIG. 9, the upper line shows the change in a threshold voltage to a cycle at programming, and lower line shows the change in a threshold voltage to a cycle at erasing. The present invention has a two time or greater memory window than that of the conventional dielectric layer structure, in which the memory window of the former is about 3.6V while the memory window of the latter is about 1.5V after 100,000 program and erase cycles.

Figure 10:
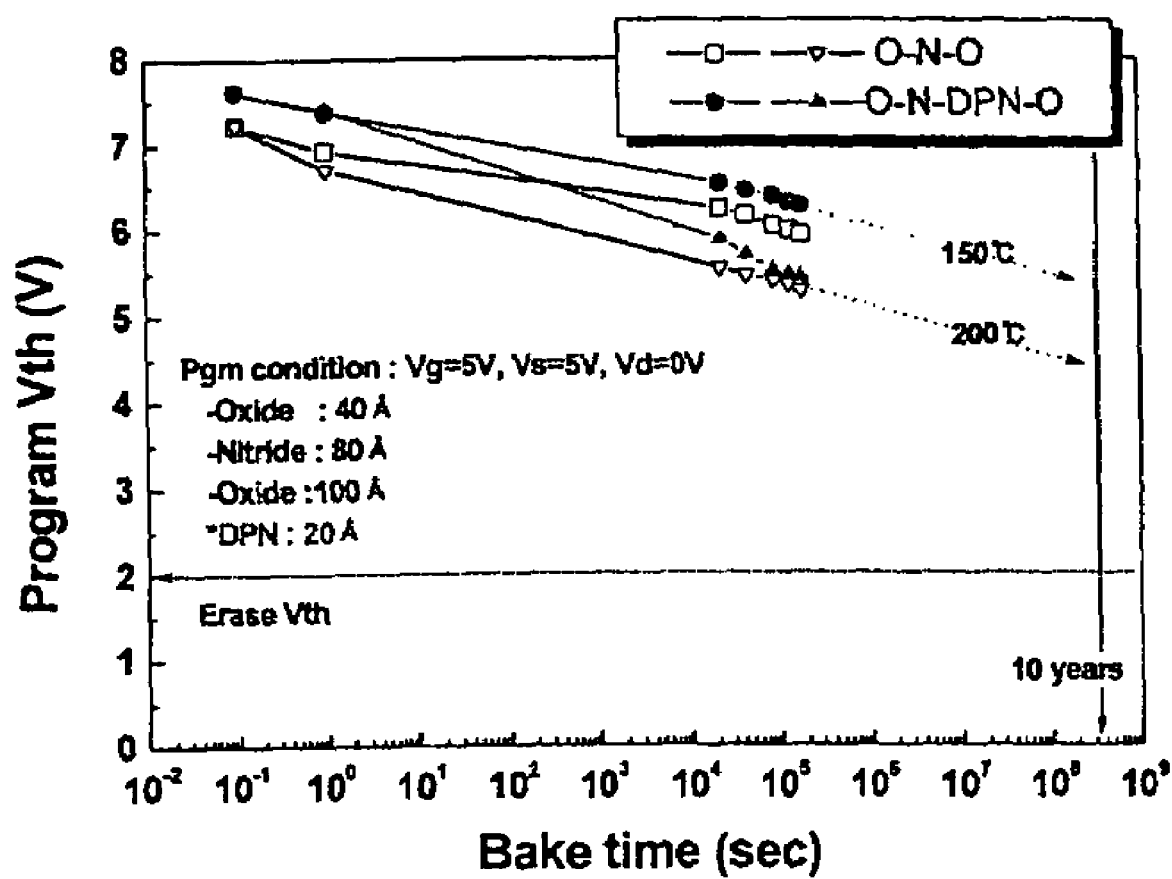
FIG. 10 is a graph showing retention comparison between a memory device having the dielectric layer structure of the prior art and a memory device having the dielectric layer structure according to the present invention.

In FIG. 10 the abscissa axis indicates a bake time and the ordinate axis indicates a program threshold voltage (Vth).

The graph in FIG. 10 confirms that both the memory cell of the prior art and the memory cell of the present invention have an expected life span of ten or more years. Both the memory cells were baked between 150° C. and 200° C.

FIGS. 11 to 16 are cross-sectional views illustrating a process sequence for a method of manufacturing a dielectric layer structure for use in a non-volatile memory device according to another embodiment of the present invention. The dielectric layer structure reduces operational voltage for a transistor, and is a local SONOS structure.

Figure 11:
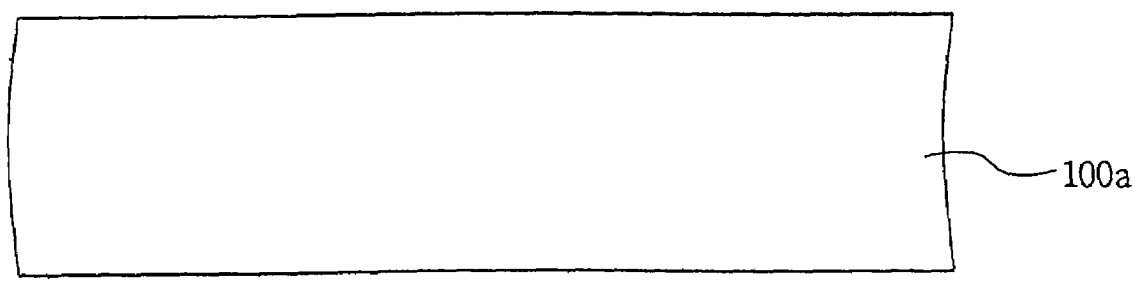
FIGS. 11 to 16 are process sectional views illustrating a process sequence for a method of manufacturing a dielectric layer structure according to another embodiment of the present invention.

As shown in FIG. 11, a semiconductor substrate 100a is provided. It is preferable that semiconductor substrate 100a is formed of silicon (Si) oxide.

Figure 12:
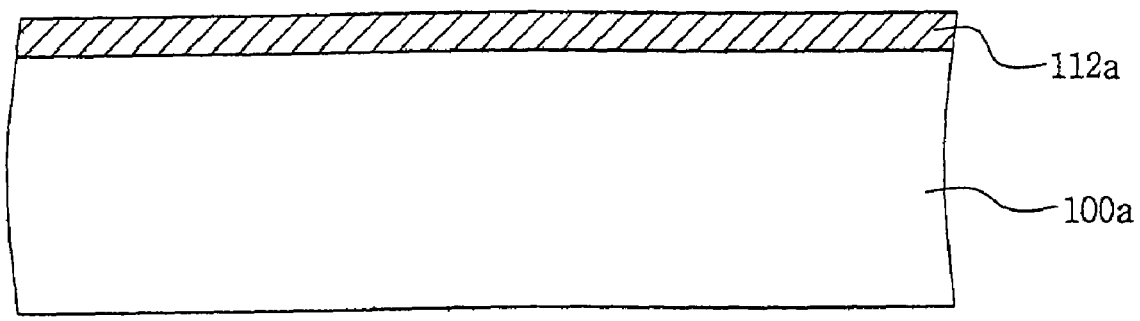

As shown in FIG. 12, a first dielectric layer 112a is formed on semiconductor substrate 100a. First dielectric layer 112a is preferably formed of silicon oxide. First dielectric layer 112a is preferably formed of a chemical vapor deposition (CVD) process or a thermal oxidation process. Further, first dielectric layer 112a is formed to a thickness of about 10 to 100 Å, preferably about 40 Å. In the SONOS structure, first dielectric layer 112a serves as a tunneling oxide layer.

Figure 13:
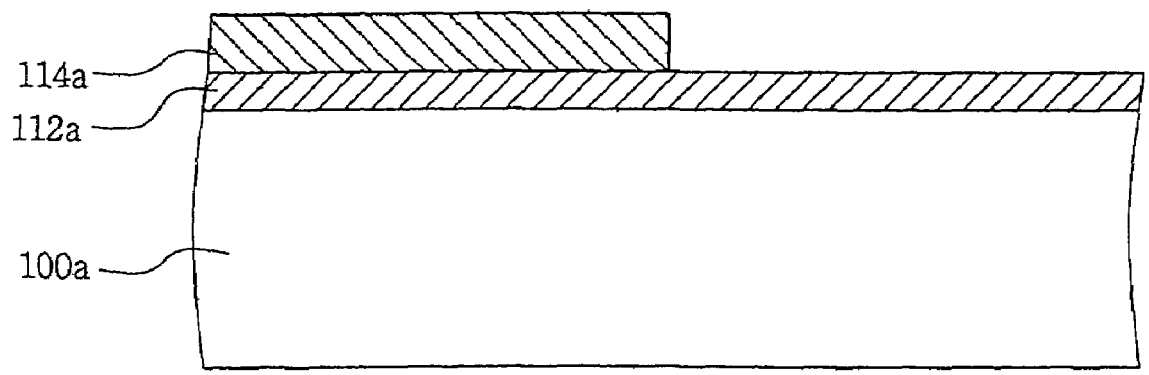

As shown in FIG. 13, a second dielectric layer 114a is formed on a portion of first dielectric layer 112a. It is preferable that second dielectric layer 114a is formed on half the surface area of first dielectric layer 112a. However, the area occupied by second dielectric layer 114a may be adjusted based on the operation voltage. In detail, second dielectric layer 114a is formed on the entire surface of first dielectric layer 112a, and then patterned by photolithographic and etching processes, such that second dielectric layer 114a is formed on a portion of first dielectric layer 112a. It is preferable that second dielectric layer 114a is nitride. Further, it is preferable that second dielectric layer 114a is formed by a chemical vapor deposition (CVD) process or a low-pressure chemical vapor deposition (LPCVD) process. Second dielectric layer 114a is formed to a thickness of about 50 to 150 Å, preferably about 80 Å.

In the SONOS structure, second dielectric layer 114a serves to store charges.

Figure 14:
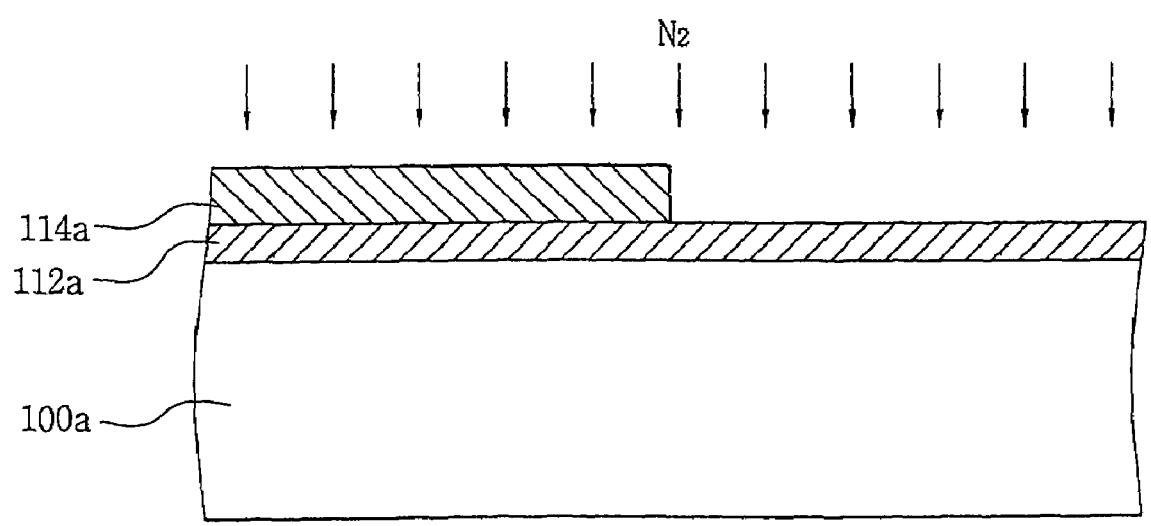

As shown in FIG. 14, the surface of second dielectric layer 114a and portion of first dielectric layer 112a not having second dielectric layer 114a formed thereon are nitrided by a decoupled plasma nitridation (DPN) process.

The DPN process uses plasma to induce a reaction between nitrogen ($N_2$) gas and second dielectric layer 114a and first dielectric layer 112a in room temperature and atmospheric pressure. The first and second dielectric layers 114a and 112a may be nitrided by the DPN process to a depth of about 20 Å. Only nitrogen gas is used in the DPN process, thus no hydrogen ($H_2$) is introduced into second dielectric layer 114.

In the RPN process, ammonia ($NH_3$) gas is used to nitridize first dielectric layer 112a and second dielectric layer 114 under a low pressure and a temperature of 400 to 500° C. In the RTN process, ammonia ($NH_3$) gas at a temperature of 700 to 800° C. is used to nitridize first dielectric layer 112a and second dielectric layer 114.

Process conditions or nitrogen containing gases for the DPN, RPN and RTN processes may be varied to nitridize first dielectric layer 112a and second dielectric layer 114.

Figure 15:
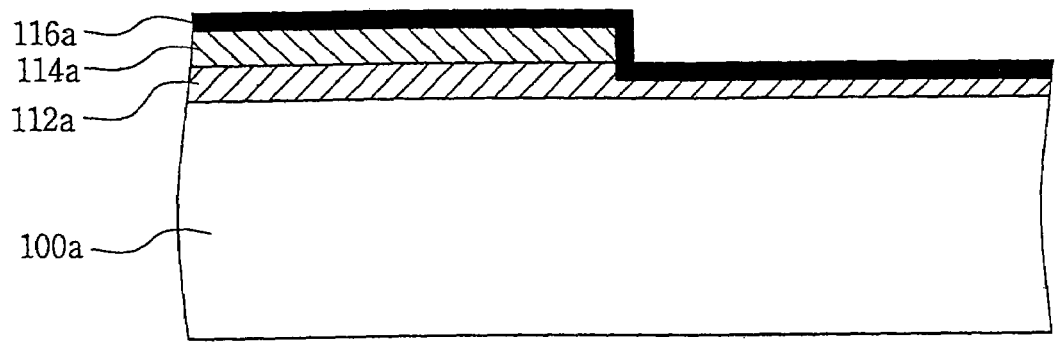

FIG. 15 shows the result from the above-described nitridation process. A nitrided portion 116a is formed on the surface of second dielectric layer 114a and a portion of first dielectric layer 112a.

Figure 16:
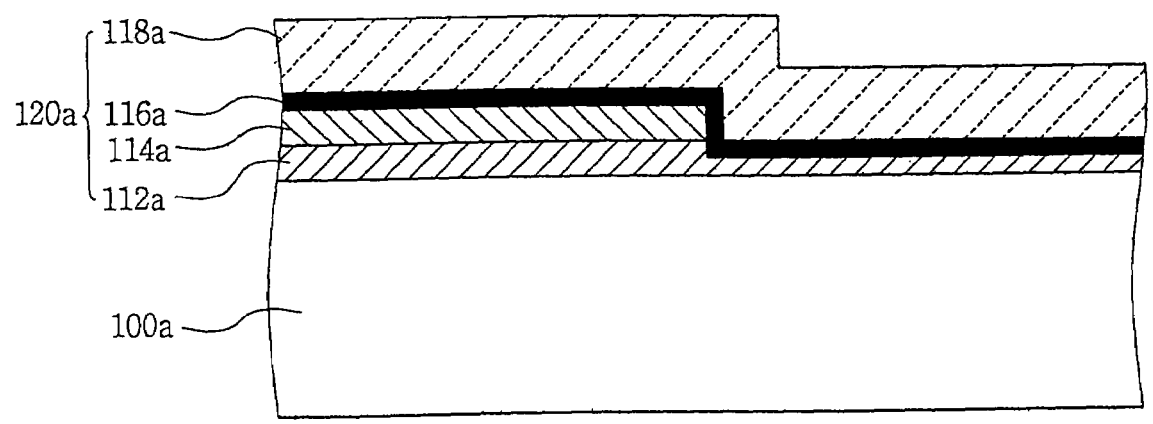

As shown in FIG. 16, a third dielectric layer 118a is formed on nitrided portion 116a. It is preferable that third dielectric layer 118a is an oxide film. Third dielectric layer 118a is preferably formed by a chemical vapor deposition (CVD) process or a thermal oxidation process. Further, third dielectric layer 118a is formed to a thickness of about 50 to 200 Å, preferably about 100 Å.

In the SONOS structure, third dielectric layer 118a serves as a blocking oxide layer.

The above described processes result in a dielectric layer structure (ONO) 120a for the non-volatile memory of another embodiment of the present invention. In subsequent processes, a gate is formed on the ONO structure.

The exemplary embodiments have been illustrated to provide a understanding of the present invention with reference to the accompanying drawings, and thus should not be construed as limiting the present invention. Further, it will be apparent that various changes and modifications may be made to the present invention by those skilled in the art without departing from the scope of the present invention.

What is claimed is:

1. A method of manufacturing a dielectric layer structure in a non-volatile memory cell having a SONOS structure:
    forming a first dielectric layer on a semiconductor substrate;
    forming a second dielectric layer on the first dielectric layer;
    patterning the second dielectric layer to expose a surface portion of the first dielectric layer;
    nitriding the exposed surface portion of the first dielectric layer and a surface of the second dielectric layer; and
    forming a third dielectric layer on the nitrided exposed surface portion of the first dielectric layer and the nitrided surface of the second dielectric layer.

2. The method of claim 1, wherein the first dielectric layer has a thickness of about 10 to 100 Å, the second dielectric layer has a thickness of about 50 to 150 Å, and the third dielectric layer has a thickness of about 50 to 200 Å.

3. The method of claim 2, wherein the first dielectric layer is formed to a thickness of about 40 Å.

4. The method of claim 2, wherein the second dielectric layer has a thickness of about 80 Å.

5. The method of claim 2, wherein the third dielectric layer is formed to a thickness of about 100 Å.

6. The method of claim 1, wherein the nitriding of the exposed surface portion of the first dielectric layer and the surface of the second dielectric layer is performed by a decoupled plasma nitridation (DPN) process.

7. The method of claim 6, wherein the first and second dielectric layers are nitrided by the DPN process to a depth of about 20 Å.

8. The method of claim 1, wherein the nitriding of the exposed surface portion of the first dielectric layer and the surface of the second dielectric layer is performed by a remote plasma nitridation (RPN) or rapid thermal nitridation (RTN) processes.

9. The method of claim 1, wherein the first and third dielectric layers are silicon oxide layers, and the second dielectric layer is a nitride layer.

10. The method of claim 1, wherein a portion of the second dielectric layer that is removed by the patterning is half a surface area of the first dielectric layer.

* * * * *